United States Patent
Shin

(10) Patent No.: US 7,679,597 B2
(45) Date of Patent: Mar. 16, 2010

(54) SCAN DRIVING CIRCUIT AND ORGANIC LIGHT EMITTING DISPLAY USING THE SAME

(75) Inventor: Dong Yong Shin, Seoul (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 634 days.

(21) Appl. No.: 11/657,669

(22) Filed: Jan. 23, 2007

(65) Prior Publication Data

US 2007/0242000 A1  Oct. 18, 2007

(30) Foreign Application Priority Data

Apr. 18, 2006 (KR) .................. 10-2006-0034960

(51) Int. Cl.
*G11C 19/001* (2006.01)
*G11C 19/181* (2006.01)
*G09G 3/36* (2006.01)

(52) U.S. Cl. .................. 345/100; 345/76; 345/82; 345/98; 345/99; 345/204; 315/169.3; 377/64

(58) Field of Classification Search .................. 345/76, 345/82, 98, 99, 100, 204; 315/169.3; 377/64
See application file for complete search history.

(56) References Cited

U.S. PATENT DOCUMENTS 6,426,743 B1 * 7/2002 Yeo et al. .................. 345/213

7,420,536 B2 * 9/2008 Jang et al. .................. 345/100
2003/0128180 A1 * 7/2003 Kim et al. .................. 345/100
2004/0227718 A1 11/2004 Park

FOREIGN PATENT DOCUMENTS

JP  2000-155550  6/2000
JP  2001-160299  6/2001

(Continued)

OTHER PUBLICATIONS

Patent Abstracts of Japan, Publication No. 2004-185684; Publication Date: Jul. 2, 2004; in the name of Kitani et al.

(Continued)

*Primary Examiner*—Richard Hjerpe
*Assistant Examiner*—Sahlu Okebato
(74) *Attorney, Agent, or Firm*—Christie, Parker & Hale, LLP

(57) ABSTRACT

A scan driving circuit includes a plurality of stages. Each stage receives three of four clocks that may be sequentially generated, receives and delays an input signal through an input terminal, and outputs an output signal through an output terminal. The input terminal of each stage is connected to the output terminal of a previous one of the stages. Each stage includes a transistor, a switch section, and a storage section. The transistor turns off/on a connection of the input terminal according to a second clock. The switch section transfers a first voltage to the output terminal according to a first clock and prevents the first voltage from being transferred to the output terminal according to the input signal. The storage section maintains a voltage of the output terminal for a predetermined time and transfers a voltage of a third clock to the output terminal according to the input signal.

24 Claims, 9 Drawing Sheets

FOREIGN PATENT DOCUMENTS

| | | |
|---|---|---|
| JP | 2003-101394 | 4/2003 |
| JP | 2004-185684 | 7/2004 |
| JP | 2005-166139 | 6/2005 |
| JP | 2005-251335 | 9/2005 |
| KR | 2002-0085205 | 11/2002 |

OTHER PUBLICATIONS

Patent Abstracts of Japan, Publication No. 2005-166139; Publication Date: Jun. 23, 2005; in the name of Ozawa et al.
Patent Abstracts of Japan, Publication No. 2001-160299, dated Jun. 12, 2001, in the name of Katsuhiko Morosawa et al.
Patent Abstracts of Japan, Publication No. 2003-101394, dated Apr. 4, 2003, in the name of Sho Nagao et al.
Korean Patent Abstracts, Publication No. 1020020085205 A, dated Nov. 16, 2002, in the name of Han Sang Lee et al.
European Search Report dated Jul. 2, 2007, for 07251479.7, in the name of Samsung SDI Co, Ltd.
Patent Abstracts of Japan, Publication No. 2000-155550, dated Jun. 6, 2000, in the name of Ju Cheon Yeo et al.
English abstract for GB 2343068, dated Apr. 6, 2000, corresponding to JP 2000-155550 listed above.
Japan Patent Abstracts, Publication No. 2005-251335, dated Sep. 15, 2005, in the name of Katsuhiko Morosawa.

* cited by examiner

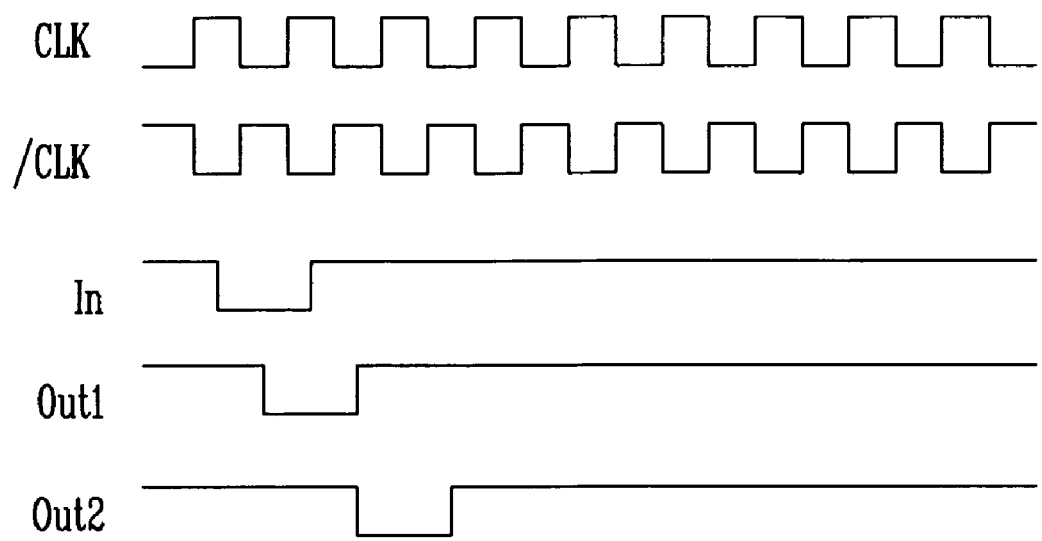

SCAN DRIVING CIRCUIT AND ORGANIC LIGHT EMITTING DISPLAY USING THE SAME

CROSS-REFERENCE TO RELATED APPLICATIONS

This application claims priority to and the benefit of Korean Patent Application No. 10-2006-0034960, filed in the Korean Intellectual Property Office on Apr. 18, 2006, the entire content of which is incorporated herein by reference.

BACKGROUND

1. Field of the Invention

The present invention relates to a scan driving circuit and an organic light emitting display using the same.

2. Discussion of Related Art

In general, an active matrix type display device such as an organic light emitting display includes a pixel array arranged at crossings between data lines and scan lines in a matrix pattern.

The scan lines include horizontal lines (i.e., row lines) of a display region having a matrix of pixels, and sequentially provide a predetermined signal, namely, a scan signal from a scan driving circuit, to the pixel array.

FIG. 1 is a block diagram showing a conventional scan driving circuit. With reference to FIG. 1, the conventional scan driving circuit includes a plurality of stages ST1 to STn, which are dependently coupled with a start pulse SP input line. The plurality of stages ST1 to STn sequentially shift a clock signal C in response to a start pulse SP to generate output signals SO1 to SOn, respectively. In this case, each of second to n-th stages ST2 to STn receives and shifts an output signal of a previous stage as a start pulse.

Accordingly, the stages generate output signals SO1 to SOn in such a way that the start pulse is sequentially shifted, and provide the output signals to the pixel array.

FIG. 2 is a circuit diagram of a stage in the scan driving circuit shown in FIG. 1. FIG. 3 is a timing diagram of the stage shown in FIG. 2. Referring to FIG. 2 and FIG. 3, conventionally, each stage of a scan driving circuit uses a master-slave flip-flop. When a clock CLK is at a low level, such a flip-flop continues to receive an input and maintains a previous output.

In contrast to this, when the clock CLK is at a high level, the flip-flop maintains an input In received at an input terminal when the clock CLK is at the low level, and outputs the received input, but no longer receives the input In.

In the aforementioned circuit, an inverter included in the flip-flop has a problem in that a static current flows when an input thereof is at a low level. Furthermore, in the flip-flop, the number of inverters having received a high-level input is the same number as that of inverters having received a low-level input. Accordingly, the static current flows through a half of all the inverters in the flip-flop, thereby causing power consumption to be increased.

In addition, in the circuit of FIG. 2A, a voltage value due to a ratio of resistance (i.e., transistors M1' and M2') connected between a power supply VDD and a ground GND determines a high level of an output voltage OUT. Low level of the output voltage OUT is set to be greater than that of the ground GND by a threshold voltage of the transistor M2'.

By way of example, due to characteristic deviations of the transistors, since levels of an input voltage are different according to respective stages, in the case where the circuit of FIGS. 2 and 2A is used, the deviation occurs when the output voltage is at a high level, with the result that the circuit may be erroneously operated.

Moreover, the deviation in a low level of the output voltage causes a deviation in on-resistance of an input transistor of an inverter included in the circuit of FIG. 2 to occur, thereby weighting a deviation in a high level of the output voltage. In particular, since a panel of an organic light emitting display uses a transistor having a great characteristic deviation, such a problem is more serious.

Further, in the inverter, an electric current flows through an input transistor to charge an output terminal, whereas the electric current flows through a load transistor to discharge the output terminal. Upon a charge of the output terminal, a source-gate voltage of the load transistor is gradually reduced, and a discharge current is accordingly reduced rapidly. This causes the discharge efficiency to be deteriorated.

SUMMARY OF THE INVENTION

Accordingly, it is an aspect of one embodiment of the present invention to provide a scan driving circuit and an organic light emitting display using the scan driving circuit. The scan driving circuit may be implemented with PMOS transistors or NMOS transistors, which switch an output voltage of the scan driving circuit from a positive source voltage to a negative source voltage.

The foregoing and/or other aspects of one embodiment of the present invention are achieved by providing a scan driving circuit including a plurality of stages. The plurality of stages are adapted to receive four clocks. Each of the plurality of stages is configured to receive three of the four clocks, to receive and delay an input signal through an input terminal, and to output an output signal through an output terminal. The input terminal of each of the plurality of stages is connected to an output terminal of a previous one of the stages. Each of the plurality of stages includes a transistor, a switch section, and a storage section. The transistor turns on/off a connection of the input terminal according to a second clock among the clocks, the second clock for inputting through a second clock terminal. The switch section transfers a first voltage to the output terminal according to a first clock among the clocks, and prevents the first voltage from being transferred to the output terminal according to the input signal, the first clock for inputting through the first clock terminal. The storage section maintains a voltage of the output terminal for a predetermined time, and transfers a voltage of a third clock among the clocks to the output terminal according to the input signal, the third clock for inputting through a third clock terminal.

According to a second aspect of the present invention, a scan driving circuit having a plurality of stages is provided. The plurality of stages are adapted to receive four clocks. Each of the plurality of stages is configured to receive three of the four clocks, to receive and delay an input signal through an input terminal, and to output an output signal through an output terminal. The input terminal of each of the plurality of stages is connected to the output terminal of a previous one of the stages. Each of the plurality of stages includes a transistor, a switch section, and a storage section. The transistor turns on/off a connection of the input terminal according to a second clock among the clocks, the second clock for inputting through a second clock terminal. The switch section transfers a first voltage to the output terminal according to a first clock among the clocks, the first clock for inputting through the first clock terminal. The storage section maintains a voltage of the output terminal for a predetermined time, and transfers a voltage of a third clock among the clocks to the output terminal according to the input signal, the third clock for inputting through a third clock terminal.

According to a third aspect of the present invention, an organic light emitting display having a display region having a plurality of pixels for displaying an image, is provided. The organic light emitting display also includes a scan driving circuit and a data driving circuit. The scan driving circuit is for transferring a scan signal to the display region, and the data driving circuit is for transferring a data signal to the display region. The scan driving circuit includes a plurality of stages. The plurality of stages are adapted to receive four clocks. Each of the plurality of stages is configured to receive three of the four clocks, to receive and delay an input signal through an input terminal, and to output an output signal through an output terminal. The input terminal of each of the plurality of stages is connected to the output terminal of a previous one of the stages. Each of the plurality of stages includes a transistor, a switch section, and a storage section. The transistor turns on/off a connection of the input terminal according to a second clock among the clocks, the second clock for inputting through a second clock terminal. The switch section transfers a first voltage to the output terminal according to a first clock among the clocks, and prevents the first voltage from being transferred to the output terminal according to the input signal, the first clock for inputting through a first clock terminal. The storage section maintains a voltage of the output terminal for a predetermined time, and transfers a voltage of a third clock among the clocks to the output terminal according to the input signal, the third clock for inputting through a third clock terminal.

An organic light emitting display having a display region having a plurality of pixels for displaying an image, is provided. The organic light emitting display also includes a scan driving circuit and a data driving circuit. The scan driving circuit is for transferring a scan signal to the display region, and a data driving circuit is for transferring a data signal to the display region. The scan driving circuit includes a plurality of stages. The plurality of stages is adapted to receive four clocks. Each of the plurality of stages is configured to receive three of the four s clocks, to receive and delay an input signal through an input terminal, and to output an output signal through an output terminal. The input terminal of each of the plurality of stages is connected to the output terminal of a previous one of the stages. Each of the plurality of stages includes a transistor, a switch section, and a storage section. The transistor turns on/off a connection of the input terminal according to a second clock among the clocks, the second clock for inputting through a second clock terminal. The switch section transfers a first voltage to the output terminal according to a first clock among the clocks, the first clock for inputting through the first clock terminal. The storage section maintains a voltage of the output terminal for a predetermined time, and transfers a voltage of a third clock among the clocks to the output terminal according to the input signal, the third clock for inputting through a third clock terminal.

BRIEF DESCRIPTION OF THE DRAWINGS

These and/or other aspects and features of the invention will become apparent and more readily appreciated from the following description of certain exemplary embodiments, taken in conjunction with the accompanying drawings of which:

FIG. 3 is a timing diagram of the stage shown in FIG. 2;

DETAILED DESCRIPTION

Figure 1:
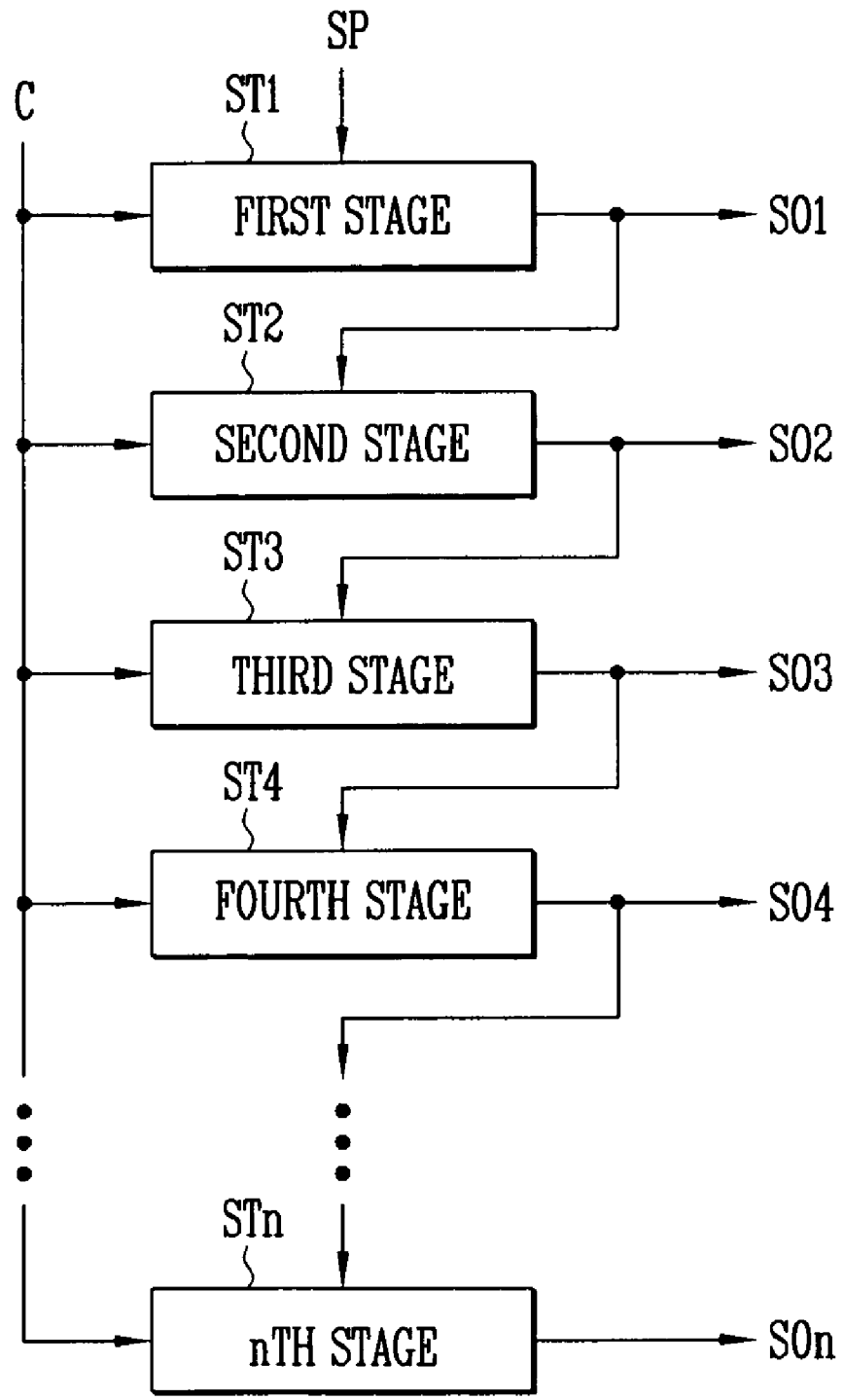
FIG. 1 is a block diagram showing a conventional scan driving circuit.
Figure 2:
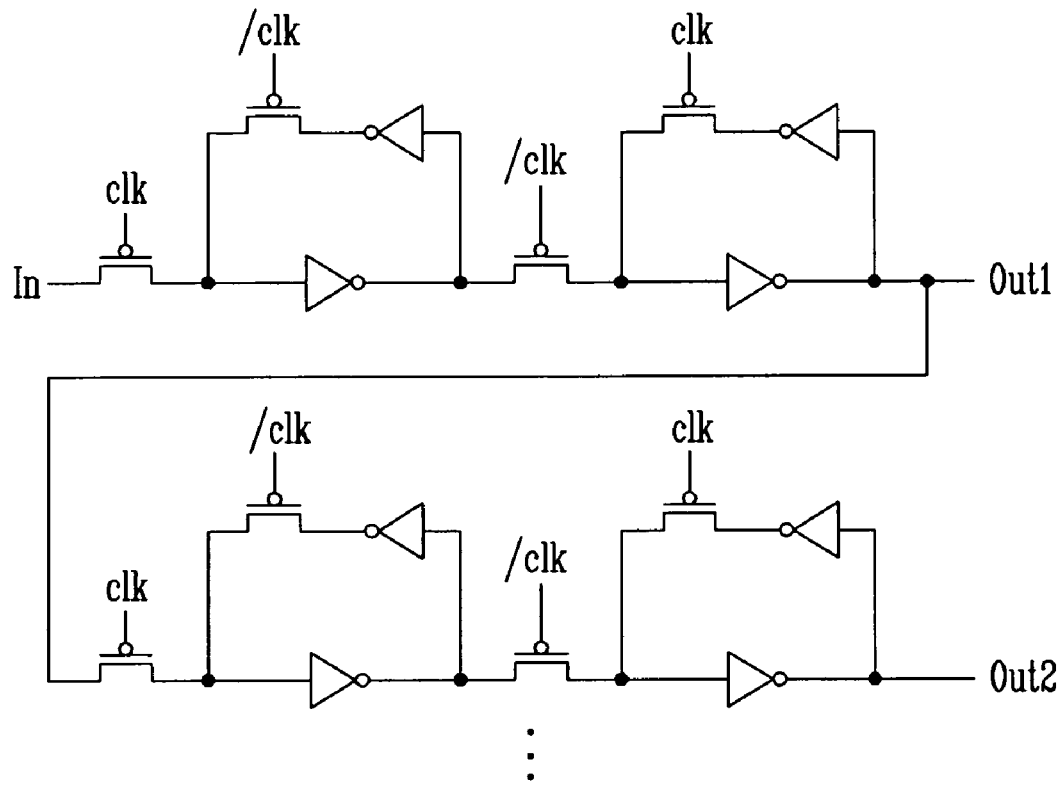
FIG. 2 is a circuit diagram of a stage in the scan driving circuit shown in FIG. 1.
Figure 2A:
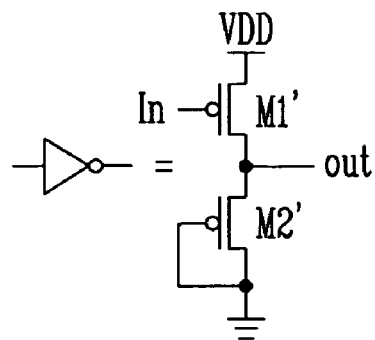
FIG. 2A is a circuit diagram of an inverter in the stage shown in FIG. 2.

Hereinafter, exemplary embodiments according to the present invention will be described with reference to the accompanying drawings. Here, when a first element is described as being connected to a second element, the first element may be not only directly connected to the second element but also may be indirectly connected to the second element via a third element. Further, elements that are not essential to the complete understanding of the invention are omitted for clarity. Also, like reference numerals refer to like elements throughout.

Figure 4:
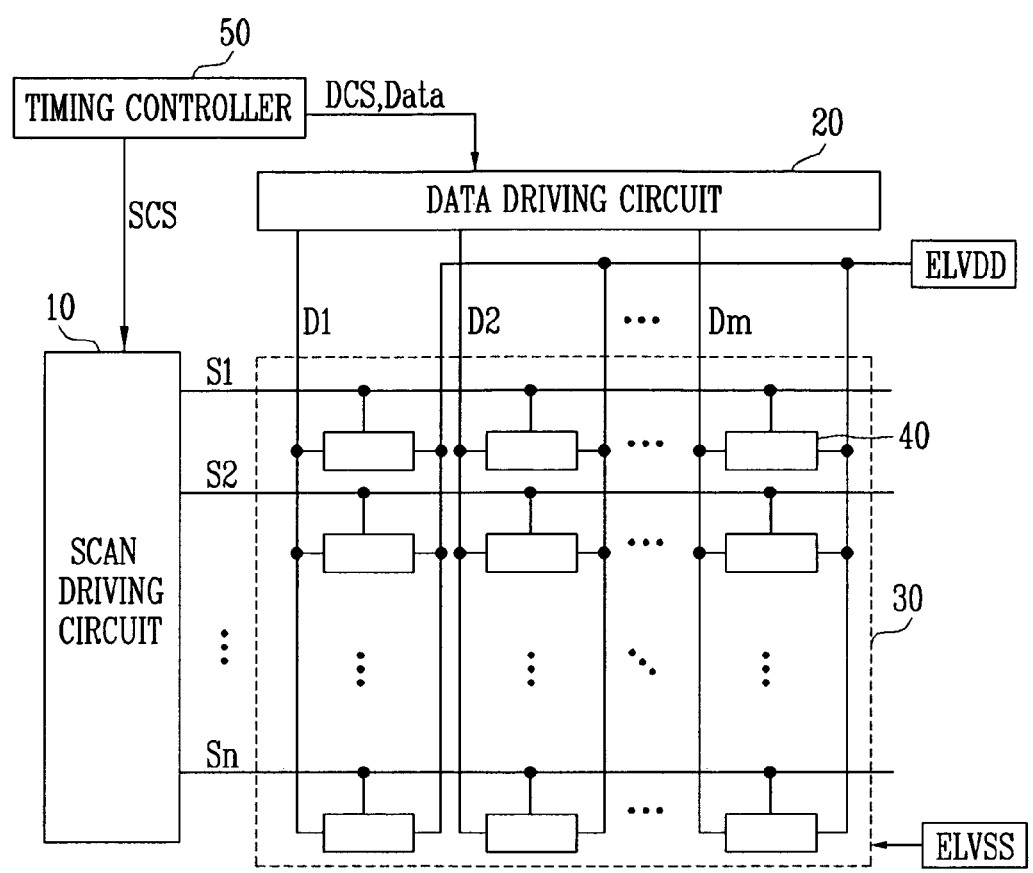
FIG. 4 is a block diagram showing an organic light emitting display according to an embodiment of the present invention.

FIG. 4 is a block diagram showing an organic light emitting display according to an embodiment of the present invention. With reference to FIG. 4, the organic light emitting display includes a display region 30, a scan driving circuit 10, a data driving circuit 20, and a timing controller 50.

The display region 30 includes a plurality of pixels 40 formed at crossing areas of scan lines S1 to Sn, and data lines D1 to Dm. The scan driving circuit 10 drives the scan lines S1 to Sn. The data driving circuit 20 drives the data lines D1 to Dm. The timing controller 50 controls the scan driving circuit 10 and the data driving circuit 20.

The timing controller 50 generates a data drive control signal DCS and a scan drive control signal SCS according to externally supplied synchronous signals. The data drive control signal DCS generated by the timing controller 50 is provided to the data driving circuit 20, and the scan drive control signal SCS is provided to the scan driving circuit 10. Furthermore, the timing controller 50 provides externally supplied data Data to the data driving circuit 20.

The data driving circuit 20 receives the data drive control signal DCS from the timing controller 50. Upon the receipt of the data drive control signal DCS, the data driving circuit 20 generates data signals, and provides the generated data signals to the data lines D1 to Dm. In this embodiment, the data driving circuit 20 provides the generated data signals to the data lines D1 to Dm every one horizontal period.

The display region 30 receives a first power from a first power supply ELVDD and a second power from a second power supply ELVSS from an exterior source, and provides them to the pixels 40. Upon the receipt of the first power ELVDD and the second power ELVSS, the pixels 40 control an amount of current that flows into the second power supply ELVSS from the first power supply ELVDD through a light emitting element corresponding to the data signal, thus generating light corresponding to the data signal.

The scan driving circuit 10 generates a scan signal in response to a scan drive control signal SCS from the timing controller 50, and sequentially provides the generated scan signal to the scan lines S1 to Sn. That is, the scan driving circuit 10 sequentially generates the scan signal to drive the plurality of pixels, and provides the scan signal to the display region 30.

Hereinafter, a construction and an operation of the scan driving circuit of an organic light emitting display according to an embodiment of the present invention will be explained.

Figure 5:
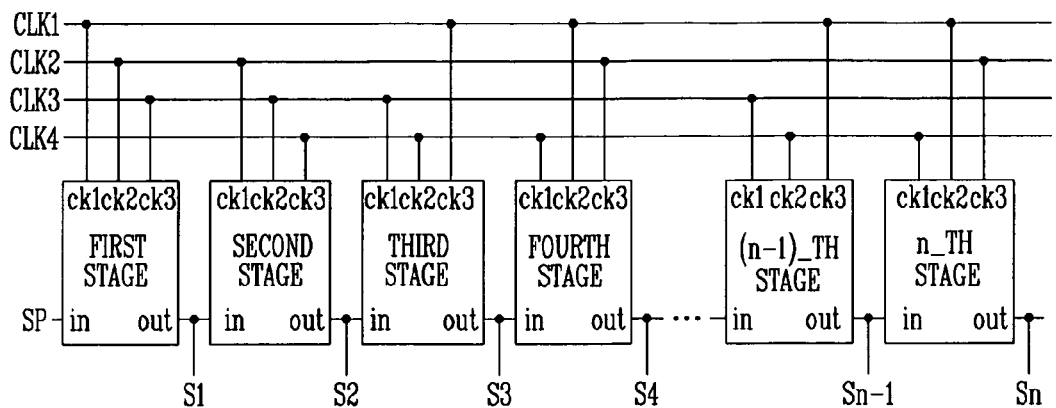
FIG. 5 is a block diagram showing a construction of a scan driving circuit according to an embodiment of the present invention.

FIG. 5 is a block diagram showing a configuration of a scan driving circuit 30 according to an embodiment of the present invention. Referring to FIG. 5, the scan driving circuit includes n stages that are dependently coupled with a start pulse input line so as to drive an m×n pixel array.

First output lines of the first n stages are coupled with first n scan lines (i.e., row lines) included in the pixel array. A start pulse SP is supplied to a first stage. Output signals of first to n−1 th stages are provided to next stages as a start pulse, respectively. Each stage receives and operates according to a first clock CLK1, a second clock CLK2, and a third clock CLK3; the second clock CLK2, the third clock CLK3, and a fourth clock CLK4; the third clock CLK3, the fourth clock CLK4, and the first clock CLK1; or the fourth clock CLK4, the first clock CLK1, and the second clock CLK2. Each stage includes a first clock terminal ck1, a second clock terminal ck2, and a third clock terminal ck3. Here, as shown, the first clock CLK1, the second clock CLK2, and the third clock CLK3 are supplied to the first clock terminal ck1, the second clock terminal ck2, and the third clock terminal ck3 of a (4 k−3)-th stage, respectively. The second clock CLK2, the third clock CLK3, and the fourth clock CLK4 are supplied to the first clock terminal ck1, the second clock terminal ck2, and the third clock terminal ck3 of a (4 k−2)-th stage, respectively. The first clock CLK1, the third clock CLK3, and the fourth clock CLK4 are supplied to the third clock terminal ck3, the first clock terminal ck1, and the second clock terminal ck2 of a (4 k−1)-th stage, respectively. The first clock CLK1, the second clock CLK2, and the fourth clock CLK4 are supplied to the second clock terminal ck2, the third clock terminal ck3, and the first clock terminal ck1 of a (4 k)-th stage, respectively. Here, k is a natural number.

That is, each stage operates in response to three of the four supplied clocks: the first clock CLK1, the second clock CLK2, the third clock CLK3, and the fourth clock CLK4.

Further, when the first stage outputs a signal in response to the first clock CLK1, the second clock CLK2, and the third clock CLK3, the second stage receives and operates according to the second clock CLK2, the third clock CLK3, and the fourth clock CLK4. When the second stage outputs a signal in response to the second clock CLK2, the third clock CLK3, and the fourth clock CLK4, the third stage receives and operates according to the third clock CLK3, the fourth clock CLK4, and the first clock CLK1. When the third stage outputs a signal in response to the third clock CLK3, the fourth clock CLK4, and the first clock CLK1, the fourth stage receives and operates according to the fourth clock CLK4, the first clock CLK1, and the second clock CLK2. That is, the first, second, third, and fourth stages sequentially output the signal to sequentially drive a display region of an organic light emitting display by lines.

An external control circuit (not shown) provides the input signals of the driving circuit, that is, a start pulse SP, the first to fourth clocks CLK1 to CLK4, and a supply voltage VDD.

Figure 6:
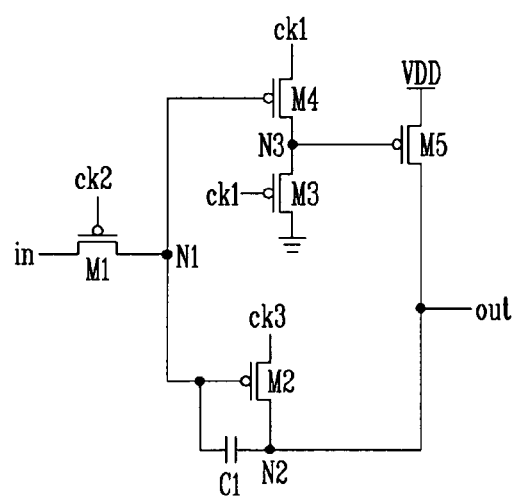
FIG. 6 is a circuit diagram showing a first embodiment of a stage of the scan driving circuit shown in FIG. 5.
Figure 7:
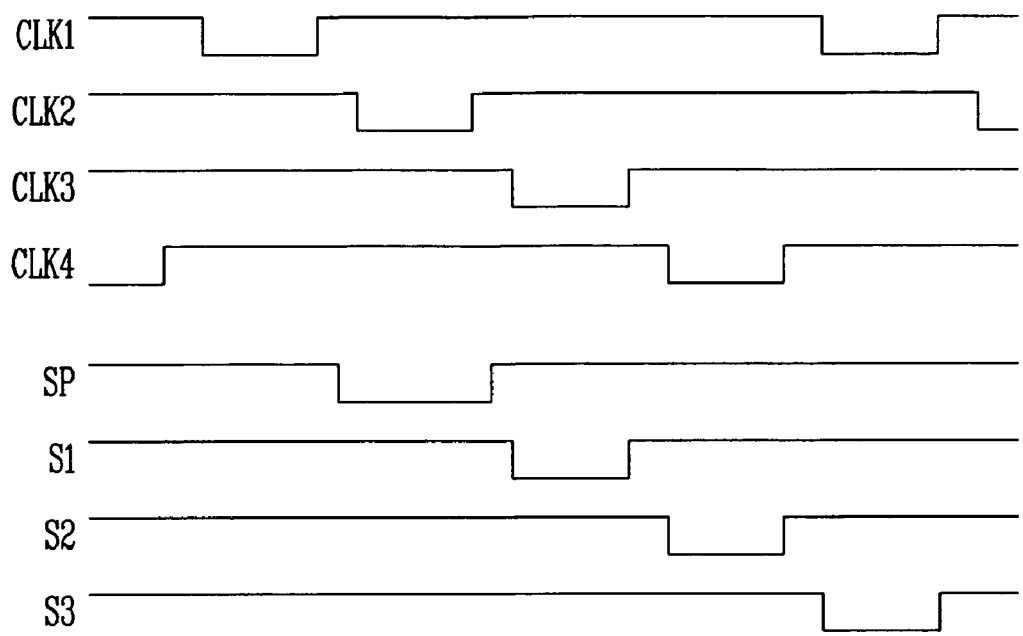
FIG. 7 is a timing diagram showing a first embodiment of an input/output waveform of the stage shown in FIG. 6.

FIG. 6 is a circuit diagram showing a first embodiment of a stage of the scan driving circuit shown in FIG. 5. FIG. 7 is a timing diagram showing a first embodiment of an input/output waveform of the stage shown in FIG. 6.

As shown in FIG. 6, in the embodiment of the present invention, transistors included in each stage are all PMOS transistors. Each stage sequentially sends a low level output through the scan driving circuit. Namely, the scan driving circuit according to an embodiment of the present invention outputs a high level signal to a display region of an active matrix type display device such as an organic light emitting display for most of the time, and sequentially outputs a low level pulse through a plurality of stages as shown in FIG. 6 and FIG. 7.

Referring to FIG. 6, the stage includes a first PMOS transistor M1, a second PMOS transistor M2, a third PMOS transistor M3, a fourth PMOS transistor M4, a fifth PMOS transistor M5, and a first capacitor C1. The first PMOS transistor M1 includes a gate coupled with a second clock terminal ck2, receives an output voltage Si of a previous stage or a first start pulse SP, and selectively transfers the output voltage Si of a previous stage or the first start pulse SP to a first node N1. The second PMOS transistor M2 includes a gate connected to the first node N1, and is coupled between the third clock terminal ck3 and a second node N2. The third PMOS transistor M3 includes a gate connected to the first clock terminal ck1, and is connected between a ground and a third node N3. The fourth PMOS transistor M4 includes a gate connected to the first node N1, and is connected between the first clock terminal ck1 and the third node N3. The fifth PMOS transistor M5 includes a gate connected to the third node N3, and is coupled between a power supply line VDD and the second node N2. The first capacitor C1 is connected between the first node N1 and the second node N2, and maintains a predetermined voltage.

Although it is shown that M3 is coupled to a ground, M3 may alternatively be coupled to a negative power supply VSS.

Hereinafter, through a circuit arrangement of (4 k−3)-th stage among stages shown in FIG. 6, operation of the stages will be explained with specific reference to the first stage, the first stage having the first clock terminal ck1 connected to the first clock CLK1, the second clock terminal ck2 connected to the second clock CLK2, and the third clock terminal ck3 connected to the third clock CLK3.

With reference to FIGS. 6 and 7, each stage of the scan driving circuit may divide one period into a precharge period, an input period, an evaluation period, and a quiescent period according to the first clock CLK1, the second clock CLK2, the third clock CLK3, and the fourth clock CLK4. During the precharge period, a low level signal is inputted to the first clock terminal ck1 of the stage, and a high level signal is inputted to the second clock terminal ck2 and the third clock terminal ck3 to precharge a capacitor C1 of the stage. During the input period, a low level signal is inputted to the second clock terminal ck2, and a high level signal is inputted to the first clock terminal ck1 and the third clock terminal ck3. Further, a start pulse SP or a scan signal Si of a previous stage is inputted through the input terminal to the first node N1 and is stored in the capacitor C1. During the evaluation period, a low level signal is inputted to the third clock terminal ck3, and a high level signal is inputted to the first clock terminal ck1 and the second clock terminal ck2, so that the stage outputs a low level signal within a predetermined period. Further, a start pulse SP or a scan signal Si of a previous stage is inputted through the input terminal. During the evaluation period, a low level signal is inputted to the third clock terminal ck3, and a high level signal is inputted through the first clock terminal ck1 and the second clock terminal ck2, so that the stage shifts and outputs a scan signal of a low level pulse by a predetermined time. In addition, the quiescent period is a time period when the fourth clock CLK4 which was not inputted to the stage has a low level.

During the precharge period, when the first clock CLK1 becomes a low level, the third PMOS transistor M3 is turned-on to make a voltage of the third node N3 a ground voltage. Accordingly, the fifth PMOS transistor M5 is turned-on to output a voltage of a power supply voltage VDD through an output terminal out, with the result that a high level voltage is outputted to the output terminal out. That is, a scan signal is outputted with a high level. Further, during the input period, the second clock CLK2 becomes a low level, the start pulse SP or the scan signal Si of a previous stage is transferred to the first node N1 through the first PMOS transistor M1, and the start pulse SP or the scan signal Si of a previous stage is stored in the capacitor C1. At this time, because the start pulse SP or the scan signal Si of a previous stage is low, the second PMOS transistor M2 and the fourth PMOS transistor M4 are turned-on. Further, the first clock CLK1 becomes a high level to turn-off the third PMOS transistor M3. When the third PMOS transistor M3 is turned-off and the fourth PMOS transistor M4 is turned-on, a first clock CLK1 of a high level is transferred to the third node N3 to turn-off the fifth PMOS transistor M5. At this time, the second PMOS transistor M2 is turned-off, so that an output terminal outputs a high level signal according to a third clock CLK3 of a high level. Moreover, during the evaluation period, the third clock CLK3 becomes a low level to float the first PMOS transistor M1. This causes the capacitor C1 to maintain a low level signal, thereby turning-on the second PMOS transistor M2 and the fourth PMOS transistor M4. In contrast to this, the third PMOS transistor M3 and the fifth PMOS transistor M5 are turned-off. Consequently, a low level signal is outputted to the output terminal out according to the third clock CLK3 of a low level.

That is, the output terminal out outputs a high level voltage by a power supply line VDD during the precharge period, and maintains a high level voltage by the capacitor C1 during the input period. Further, during the evaluation period, a voltage corresponding to the third clock CLK3 of a low level is outputted. When the third clock CLK3 becomes a low level, a voltage of the output terminal out drops. In contrast to this, when the third clock CLK3 becomes a high level, the voltage of the output terminal out again becomes a high level. Accordingly, the output terminal out outputs a scan signal. Furthermore, during the quiescent period, the first clock CLK1, the second clock CLK2, and the third clock CLK3 are transferred with a high level, but the fourth clock CLK4 of a low level is not transferred to the stage, so that the stage does not operate in response to clocks.

As a result, when a low level signal is not inputted to an input terminal in of each stage, the second PMOS transistor M2 is turned-off, so that the output terminal out maintains a high level signal. Thus, only when each stage receives the start pulse SP or a low level signal of a previous stage, it outputs a low level signal that results in a sequential output of the scan signal.

Figure 8:
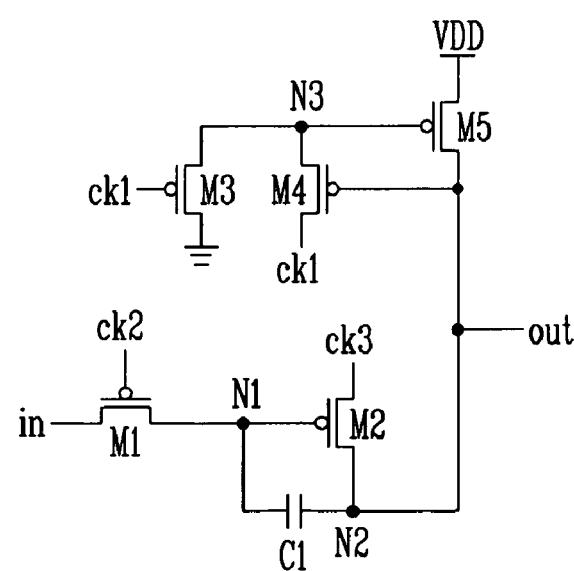
FIG. 8 is a circuit diagram showing a second embodiment of a stage of the scan driving circuit shown in FIG. 5.

FIG. 8 is a circuit diagram showing a second embodiment of a stage of the scan driving circuit shown in FIG. 5. Referring to FIG. 8, the second embodiment of a stage includes a first PMOS transistor M1, a second PMOS transistor M2, a third PMOS transistor M3, a fourth PMOS transistor M4, a fifth PMOS transistor M5, and a capacitor C1.

The first PMOS transistor M1 transfers an input signal to the first node N1 in response to the second clock CLK2, and the second PMOS transistor M2 transfers the third clock CLK3 to the second node N2 corresponding to a voltage of the first node N1. The third PMOS transistor M3 transfers a ground voltage to a gate of the fifth transistor PMOS M5 in response to the first clock CLK1. A gate of the fourth PMOS transistor M4 is connected to the output terminal out, and the fourth transistor M4 transfers the first clock CLK1 to a gate of the fifth PMOS transistor M5 corresponding to a voltage of the output terminal out. Further, the fifth PMOS transistor M5 transfers a voltage of a power supply line VDD to the output terminal corresponding to a voltage of a gate thereof. Moreover, the capacitor C1 is connected between the first node N1 and the second node N2, and maintains a predetermined voltage.

The stage having the construction as described above receives and operates according to the first to third clocks CLK1 to CLK3 shown in FIG. 7. During the precharge period, the fifth PMOS transistor M5 is turned-on in response to the first clock CLK1 to output a high level signal to the output terminal out by a voltage of the power supply line VDD. During the input period, the start pulse SP or a scan signal Si of a previous stage is stored in the capacitor C1 in response to the second clock CLK2. Next, the voltage stored in the capacitor C1 causes a voltage of the third clock CLK3 to be outputted, so that the output terminal out maintains a high level signal. At this time, when a voltage of the output terminal has a low level, the fourth PMOS transistor M4 transfers a high level signal to a gate of the fifth PMOS transistor M5, thereby preventing a voltage of the power supply line VDD from being transferred to the output terminal.

Figure 9:
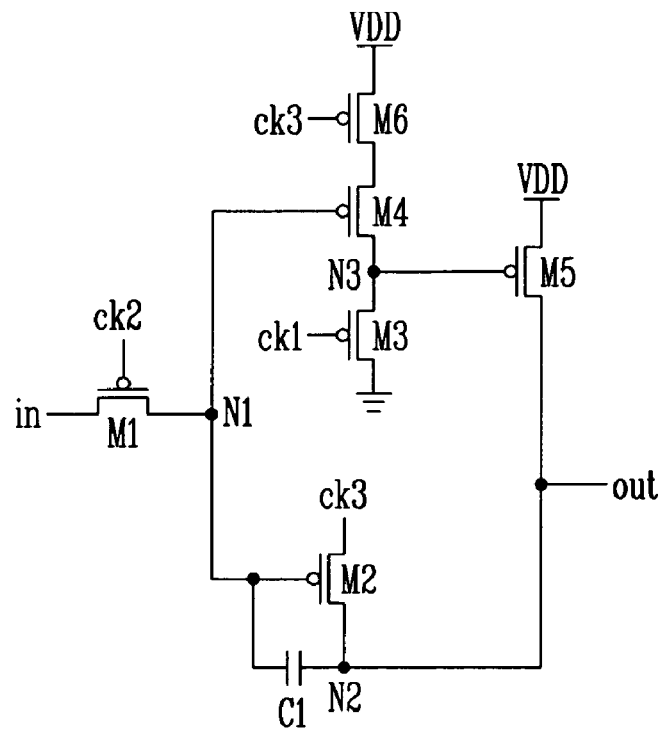
FIG. 9 is a circuit diagram showing a third embodiment of a stage of the scan driving circuit shown in FIG. 5.

FIG. 9 is a circuit diagram showing a third embodiment of a stage of the scan driving circuit shown in FIG. 5. The stage shown in FIG. 9 has substantially the same construction and functions as those of FIG. 6. The difference of the stage of FIG. 9 from that of the FIG. 6 is that the sixth PMOS transistor M6 is connected to a source of the fourth PMOS transistor M6, and a power supply line VDD is connected to a source of the sixth PMOS transistor M6. Accordingly, when the third clock CLK3 has a low level, the fourth PMOS transistor M4 is turned-on, so that a voltage of the power supply line VDD is transferred to the third node N3 to turn-off the fifth PMOS transistor M5. In other words, the voltage of the power supply line VDD which is not a clock, is transferred to a gate of the fifth PMOS transistor M5 to ensure a turning-off state of the fifth PMOS transistor M5. Accordingly, when the third clock CLK3 has a low level, the stage prevents a voltage of the power supply line VDD from being transferred to an output terminal through the fifth PMOS transistor M5. Thus, when the third clock CLK3 has a low level, the stage ensures a voltage of the output terminal to be dropped to a low level.

Figure 10:
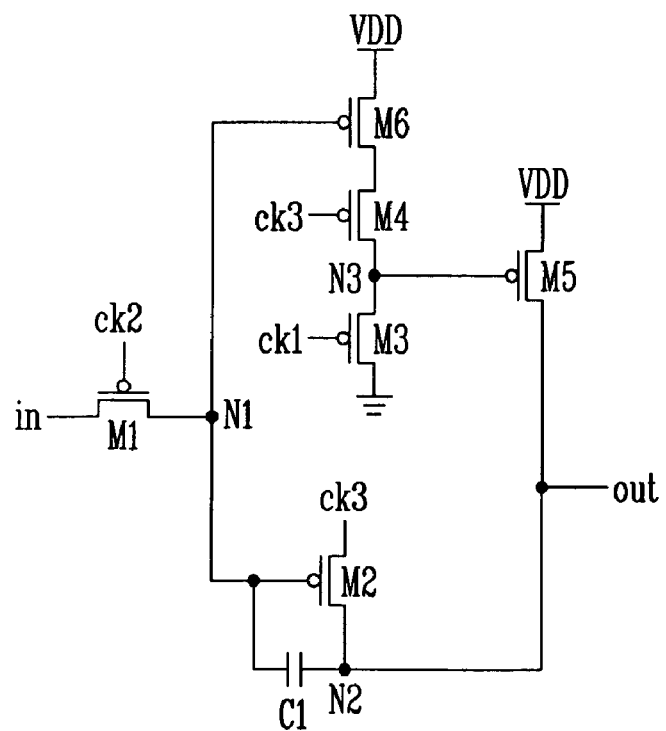
FIG. 10 is a circuit diagram showing a fourth embodiment of a stage of the scan driving circuit shown in FIG. 5.

FIG. 10 is a circuit diagram showing a fourth embodiment of a stage of the scan driving circuit shown in FIG. 5. With reference to FIG. 10, a stage of FIG. 10 has substantially the same construction and functions as those of FIG. 9. In particular, when the third clock CLK3 has a low level, a voltage of the power supply line VDD is transferred to the third node N3 in the same manner as that of FIG. 9. The difference of a stage of FIG. 10 from that of the FIG. 9 is that the third clock CLK3 is transferred to a gate of the fourth PMOS transistor M4, and a gate of the sixth PMOS transistor M6 is connected to the third node N3.

Figure 11:
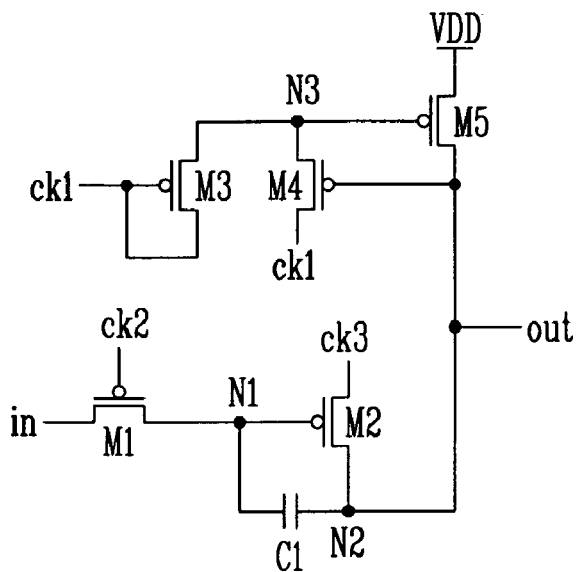
FIG. 11 is a circuit diagram showing a fifth embodiment of a stage of the scan driving circuit shown in FIG. 5.

FIG. 11 is a circuit diagram showing a fifth embodiment of a stage of the scan driving circuit shown in FIG. 5. With reference to FIG. 11, a stage of FIG. 11 has substantially the same construction and functions as those of FIG. 8 except that a source and a gate of a third PMOS transistor M3 receive the first clock CLK1. Accordingly, when the first clock CLK1 has a low level, the fifth PMOS transistor M5 is turned-on. Remaining operations of the stage shown in the FIG. 11 is the same as that of FIG. 8.

Figure 12:
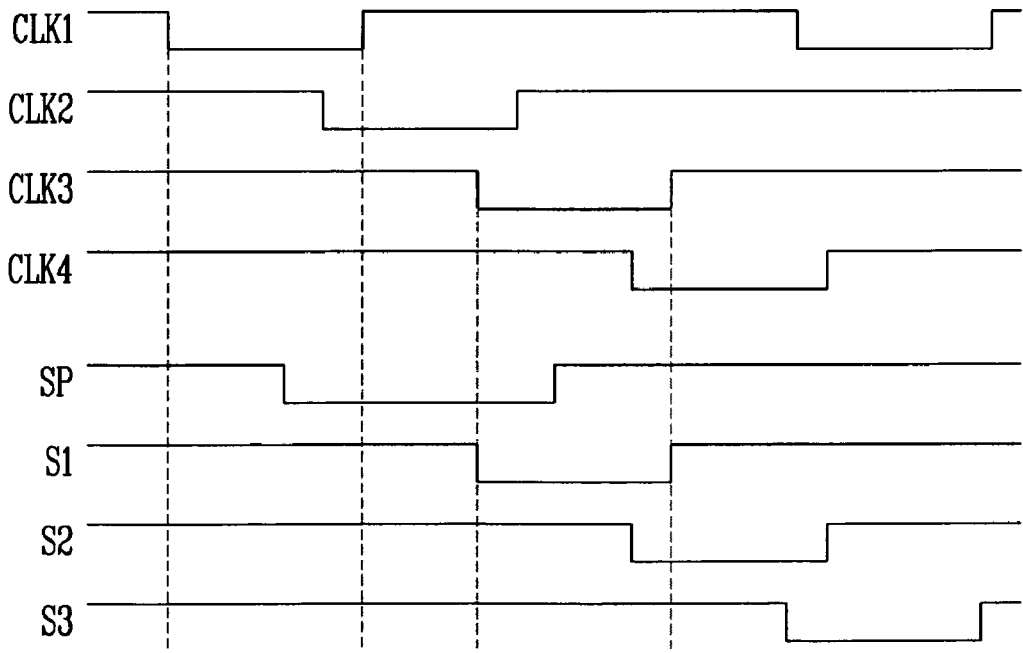
FIG. 12 is a timing diagram of the stage shown in FIG. 11.

FIG. 12 is a timing diagram of the stage shown in FIG. 11. With reference to FIG. 12, signal waveforms of FIG. 12 are applicable to stages of FIG. 8 to FIG. 11. FIG. 11 shows an operation of the stage when at least two of the first to fourth clocks CLK1 to CLK4 overlap with each other by external influences.

In FIG. 11, due to the second to fourth clocks CLK2 to CLK4, the first and second clocks CLK1 and CLK2, the second and third clocks CLK2 and CLK3, and the third and fourth clocks CLK3 and CLK4 overlap with each other. During the evaluation period among precharge period, the input period, the evaluation period, and the quiescent period, the scan signal operates corresponding to an operation of the third clock CLK3. During the quiescent period according to the fourth clock CLK4, the fourth clock CLK4 is not inputted to the stage, so that the fourth clock CLK4 does not influence an operation of the stage. Accordingly, an output scan signal of the stage varies depending on a waveform of the third clock CLK3. As a result, even if certain parts of respective clocks overlap with each other, a waveform of the scan signal is not distorted.

However, after the evaluation period finishes without reaching the quiescent period in response to the fourth clock CLK4, when the precharge period again comes, a voltage of a drive power source is transferred to the output terminal out in response to the first clock CLK1, thereby distorting a waveform of the scan signal. This prevents a waveform of the scan signal during the quiescent period after the precharge period from being distorted.

Figure 13:
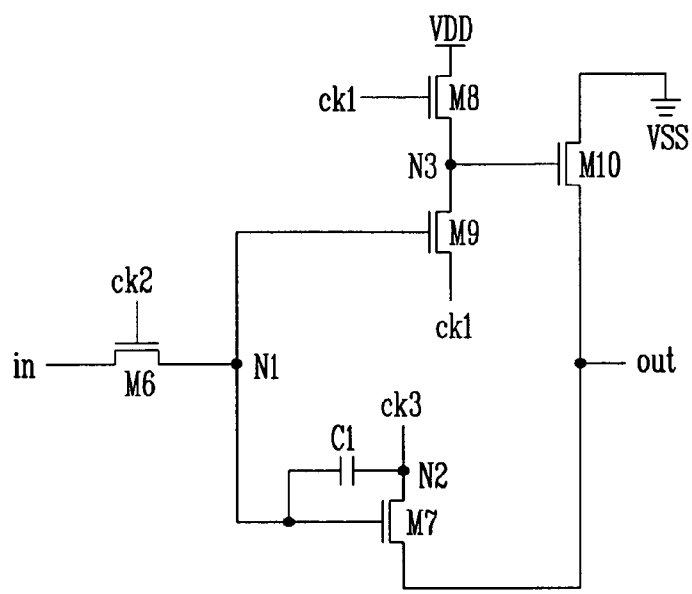
FIG. 13 is a circuit diagram showing a sixth embodiment of a stage of the scan driving circuit shown in FIG. 5.
Figure 14:
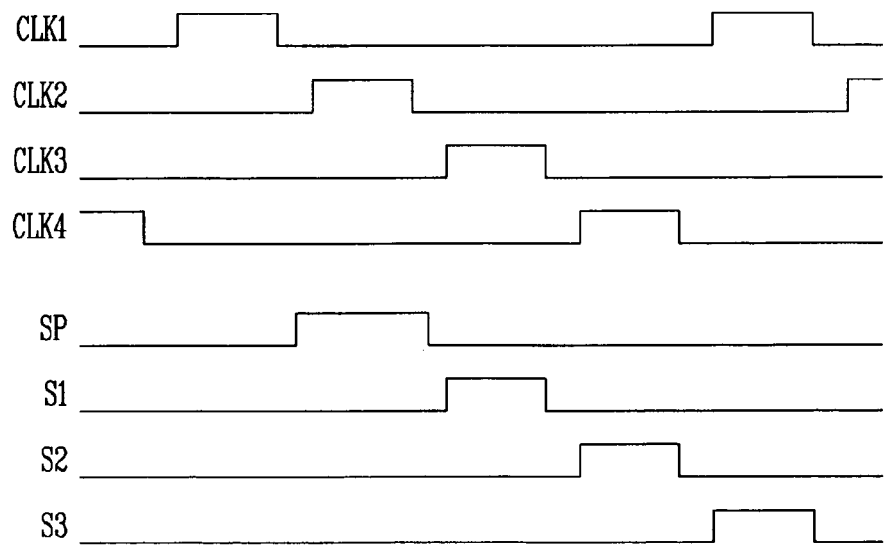
FIG. 14 is a timing diagram of the stage shown in FIG. 13.

FIG. 13 is a circuit diagram showing a sixth embodiment of a stage of the scan driving circuit shown in FIG. 5. FIG. 14 is a timing diagram of the stage shown in FIG. 13. With reference to FIG. 13 and FIG. 14, the stage is constructed by NMOS transistors M6, M7, M8, M9, and M10. A stage of FIG. 13 has substantially the same construction as that of FIG. 6, and respective transistors perform substantially the same operation as that of FIG. 6. In other words, the transistors M6, M7, M8, M9, and M10 perform substantially the same functions as transistors M1, M2, M3, M4, and M5, respectively.

Since the scan driving circuit and an organic light emitting display using the same of exemplary embodiments according to the present invention switch an output voltage from a positive source voltage to a negative source voltage, an operation speed is increased. Furthermore, even if a clock transferred to the scan driving circuit is erroneously operated, a change of a waveform of a scan signal is not great.

Although certain exemplary embodiments of the present invention have been shown and described, it would be appreciated by those skilled in the art that changes might be made in these embodiments without departing from the principles and spirit of the invention, the scope of which is defined in the claims and their equivalents.

What is claimed is:

1. A scan driving circuit comprising a plurality of stages, the plurality of stages being for receiving four clocks, wherein each of the plurality of stages is configured to receive three of the four clocks, to receive and delay an input signal through an input terminal, and to output an output signal through an output terminal, wherein the input terminal of each of the plurality of stages is connected to the output terminal of a previous one of the stages, wherein each of the plurality of stages comprises:

a transistor for turning on/off a connection of the input terminal according to a second clock among the clocks, the second clock for inputting through a second clock terminal;

a switch section for transferring a first voltage to the output terminal according to a first clock among the clocks, and for preventing the first voltage from being transferred to the output terminal according to the input signal, the first clock for inputting through a first clock terminal; and a storage section for maintaining a voltage of the output terminal for a predetermined time, and for transferring a voltage of a third clock among the clocks to the output terminal according to the input signal, the third clock for inputting through a third clock terminal.

2. The scan driving circuit as claimed in claim 1, wherein the storage section comprises:

a second transistor connected to the transistor for transferring the third clock to a second node according to a voltage of a first node that received the input signal; and a capacitor for maintaining a voltage between the first node and the second node.

3. The scan driving circuit as claimed in claim 1, wherein the switch section comprises:

a second transistor for transferring a second voltage to a node according to a voltage of the first clock;

a third transistor for transferring the voltage of the first clock to the node according to the input signal, wherein the node is between the second transistor and third transistor;

a fourth transistor including a gate connected to the node, the fourth transistor for transferring the first voltage to the output terminal according to a voltage of the node.

4. The scan driving circuit as claimed in claim 3, wherein the second voltage is a ground voltage.

5. The scan driving circuit as claimed in claim 1, wherein the switch section comprises:

a second transistor including a gate connected to the first clock terminal, a source connected to a second voltage, and a drain connected to a second node;

a third transistor including a gate connected to a first node, a source connected to the first clock terminal, and a drain connected to the second node;

a fourth transistor including a gate connected to the second node, a source connected to the first voltage, and a drain connected to the output terminal.

6. The scan driving circuit as claimed in claim 1, wherein the switch section comprises:

a second transistor including a gate connected to the first clock terminal, a source connected to a second voltage, and a drain connected to a second node;

a third transistor including a gate connected to a first node which is connected to the transistor, a source for receiving the first voltage, and a drain connected to the second node;

a fourth transistor including a gate connected to the second node, a source connected to the first voltage, and a drain connected to the output terminal; and a fifth transistor including a gate connected to the third clock terminal and a source connected to the first voltage, the fifth transistor for transferring the first voltage to the source of the third transistor.

7. The scan driving circuit as claimed in claim 1, wherein the switch section comprises:
   a second transistor including a gate connected to the first clock terminal, a source connected to a second voltage, and a drain connected to a second node;
   a third transistor including a gate connected to the third clock terminal, and a source for receiving the first voltage, and a drain connected to the second node; and
   a fourth transistor including a gate connected to the second node, a source connected to the first voltage, and a drain connected to the output terminal; and
   a fifth transistor including a gate connected to a first node which is connected to the transistor and a source connected to the first voltage, the fifth transistor for transferring the first voltage to the source of the third transistor.

8. The scan driving circuit as claimed in claim 1, wherein the plurality of stages are adapted to operate during a precharge period, an input period, an evaluation period, and a quiescent period, wherein each of the plurality of stages is adapted to initialize the storage section during the precharge period, to receive and store a predetermined signal during the input period, to output a scan signal corresponding to the predetermined signal during the evaluation period, and not to operate in response to the first clock, the second clock, and the third clock during the quiescent period.

9. The scan driving circuit as claimed in claim 8, wherein each of the plurality of stages is adapted to operate in the input period when the previous one of the stages outputs a low level signal.

10. The scan driving circuit as claimed in claim 1, wherein the four clocks have the same period, but are shifted in phase from each other.

11. The scan driving circuit as claimed in claim 1, wherein the first voltage is a voltage of a drive power source.

12. A scan driving circuit comprising a plurality of stages, the plurality of stages being for receiving four clocks, wherein each of the plurality of stages is configured to receive three of the four clocks, to receive and delay an input signal through an input terminal, and to output an output signal through an output terminal, wherein the input terminal of each of the plurality of stages is connected to the output terminal of a previous one of the stages, wherein each of the plurality of stages comprises:
   a transistor for turning on/off a connection of the input terminal according to a second clock among the clocks, the second clock for inputting through a second clock terminal;
   a switch section for transferring a first voltage to the output terminal according to a first clock among the clocks, the first clock for inputting through a first clock terminal; and
   a storage section for maintaining a voltage of the output terminal for a predetermined time, and for transferring a voltage of a third clock among the clocks to the output terminal according to the input signal, the third clock for inputting through a third clock terminal.

13. The scan driving circuit as claimed in claim 12, wherein the storage section comprises:
   a second transistor connected to the transistor, the second transistor for transferring the third clock to a second node according to a voltage of a first node that received the input signal; and
   a capacitor for maintaining a voltage between the first node and the second node.

14. The scan driving circuit as claimed in claim 12, wherein the switch section comprises:
   a second transistor for transferring a second voltage to a node according to a voltage of the first clock;
   a third transistor including a gate connected to the output terminal, a source connected to the first clock terminal, and a drain connected to the node; and
   a fourth transistor including a gate connected to the node, a source connected to the first voltage, and a drain connected to the output terminal.

15. The scan driving circuit as claimed in claim 14, wherein the second voltage is a ground voltage.

16. The scan driving circuit as claimed in claim 12, wherein the switch section comprises:
   a second transistor including a gate and a source connected to the first clock terminal, and a drain connected to a node;
   a third transistor including a gate connected to the output terminal, a source connected to the first clock terminal, and a drain connected to the node; and
   a fourth transistor including a gate connected to the node, a source connected to the first voltage, and a drain connected to the output terminal.

17. The scan driving circuit as claimed in claim 12, wherein the plurality of stages are adapted to operate during a precharge period, an input period, an evaluation period, and a quiescent period, wherein each of the plurality of stages is adapted to initialize the storage section during the precharge period, to receive and store a predetermined signal during the input period, to output a scan signal corresponding to the predetermined signal during the evaluation period, and not to operate in response to the first clock, the second clock, and the third clock during the quiescent period.

18. The scan driving circuit as claimed in claim 12, wherein the first clock, the second clock, and the third clock have the same period, but are shifted in phase from each other.

19. The scan driving circuit as claimed in claim 12, wherein each of the plurality of stages is adapted to operate in the input period when a previous one of the stages outputs a low level signal.

20. The scan driving circuit as claimed in claim 12, wherein the first voltage is a voltage of a drive power source.

21. An organic light emitting display comprising:
   a display region having a plurality of pixels for displaying an image;
   a scan driving circuit for transferring a scan signal to the display region; and
   a data driving circuit for transferring a data signal to the display region,
   wherein the scan driving circuit comprises a plurality of stages, the plurality of stages being for receiving four clocks, wherein each of the plurality of stages is configured to receive three of the four clocks, to receive and delay an input signal through an input terminal, and to output an output signal through an output terminal, wherein the input terminal of each of the plurality of stages is connected to the output terminal of a previous one of the stages, wherein each of the plurality of stages comprises:
   a transistor for turning on/off a connection of the input terminal according to a second clock among the clocks, the second clock for inputting through a second clock terminal;
   a switch section for transferring a first voltage to the output terminal according to a first clock among the clocks, and for preventing the first voltage from being transferred to the output terminal according to the input signal, the first clock for inputting through a first clock terminal; and a storage section for maintaining a voltage of the output terminal for a predetermined time, and for transferring a voltage of a third clock among the clocks to the output terminal according to the input signal, the third clock for inputting through a third clock terminal.

22. The organic light emitting display as claimed in claim 21, wherein the plurality of stages are adapted to operate during a precharge period, an input period, and an evaluation period, wherein each of the plurality of stages is adapted to initialize the storage section and to output a high level voltage during the precharge period, to receive the input signal and to maintain the high level voltage during the input period, and to output a low level voltage during the evaluation period.

23. An organic light emitting display comprising:

a display region having a plurality of pixels for displaying an image;

a scan driving circuit for transferring a scan signal to the display region; and a data driving circuit for transferring a data signal to the display region, wherein the scan driving circuit comprises a plurality of stages, the plurality of stages being for receiving four clocks, wherein each of the plurality of stages is configured to receive three of the four clocks, to receive and delay an input signal through an input terminal, and to output an output signal through an output terminal, wherein the input terminal of each of the plurality of stages is connected to the output terminal of a previous one of the stages, wherein each of the plurality of stages includes:

a transistor for turning on/off a connection of the input terminal according to a second clock among the clocks, the second clock for inputting through a second clock terminal;

a switch section for transferring a first voltage to the output terminal according to a first clock among the clocks, the first clock for inputting through a first clock terminal; and a storage section for maintaining a voltage of the output terminal for a predetermined time, and for transferring a voltage of a third clock among the clocks to the output terminal according to the input signal, the third clock for inputting through a third clock terminal.

24. The organic light emitting display as claimed in claim 23, wherein the plurality of stages are adapted to operate during a precharge period, an input period, and an evaluation period, wherein each of the plurality of stages is adapted to initialize the storage section and to output a high level voltage during the precharge period, to receive the input signal and to maintain a high level voltage during the input period, and to output a low level voltage during the evaluation period.

* * * * *